United States Patent
Rodrigues et al.

(10) Patent No.: US 11,206,032 B2
(45) Date of Patent: Dec. 21, 2021

(54) ANALOG-TO-DIGITAL CONVERTER CIRCUIT AND METHOD FOR ANALOG-TO-DIGITAL CONVERSION

(71) Applicant: ams International AG, Rapperswil (CH)

(72) Inventors: Rodolfo Rodrigues, Rapperswil (CH); Flavio Santos, Rapperswil (CH)

(73) Assignee: AMS INTERNATIONAL AG, Rapperswil (CH)

( * ) Notice: Subject to any disclaimer, the term of this patent is extended or adjusted under 35 U.S.C. 154(b) by 34 days.

(21) Appl. No.: 16/634,925

(22) PCT Filed: Jul. 12, 2018

(86) PCT No.: PCT/EP2018/068953
§ 371 (c)(1),
(2) Date: Jan. 29, 2020

(87) PCT Pub. No.: WO2019/025152
PCT Pub. Date: Feb. 7, 2019

(65) Prior Publication Data
US 2021/0099182 A1 Apr. 1, 2021

(30) Foreign Application Priority Data
Jul. 31, 2017 (EP) .................................... 17183983

(51) Int. Cl.
*H03M 1/06* (2006.01)
*H04N 5/374* (2011.01)
*H04N 5/378* (2011.01)

(52) U.S. Cl.
CPC .......... *H03M 1/0685* (2013.01); *H04N 5/374* (2013.01); *H04N 5/378* (2013.01)

(58) Field of Classification Search
CPC ...... H04N 5/374; H04N 5/378; H04N 5/3575; H03M 1/0685; H03M 1/59; H03M 1/123
See application file for complete search history.

(56) References Cited

U.S. PATENT DOCUMENTS

| | | | |
|---|---|---|---|
| 2009/0174442 A1* | 7/2009 | Kim ....................... | H04N 5/378 327/134 |
| 2015/0042859 A1* | 2/2015 | Lee ........................ | H04N 5/378 348/311 |

(Continued)

FOREIGN PATENT DOCUMENTS

GB 2421374 6/2006

OTHER PUBLICATIONS

European Patent Office, International Search Report for PCT/EP2018/068953 dated Oct. 20, 2018.

*Primary Examiner* — Lin Ye
*Assistant Examiner* — John H Morehead, III
(74) *Attorney, Agent, or Firm* — MH2 Technology Law Group LLP

(57) ABSTRACT

In an embodiment an analog-to-digital converter circuit has an input for receiving at least a first analog signal level, a ramp generator adapted to provide a ramp signal having a constant and adjustable starting level which splits into a first section which is rising and a second section which is falling concurrently to the first section's rising, wherein the starting level lies within an input range of the analog-to-digital converter circuit, a comparison unit which is coupled by its first input to the input of the analog-to-digital converter circuit and is coupled by its second input in a switchable manner to the ramp generator, a counter which is coupled to a control unit, and the control unit which is coupled to an output of the comparison unit, wherein the control unit is prepared to enable the counter depending on a comparison of the ramp signal with the first analog signal level and to (Continued)

determine a digital value as a function of a count of the counter reached at an intersection point of the ramp signal with at least the first analog signal level.

13 Claims, 9 Drawing Sheets

(56) References Cited

U.S. PATENT DOCUMENTS

| | | | |
|---|---|---|---|
| 2015/0138413 A1 | 5/2015 | Sato | |
| 2016/0165166 A1* | 6/2016 | Koh | H04N 5/3575 |
| | | | 348/302 |
| 2017/0127001 A1* | 5/2017 | Song | H04N 5/378 |

* cited by examiner

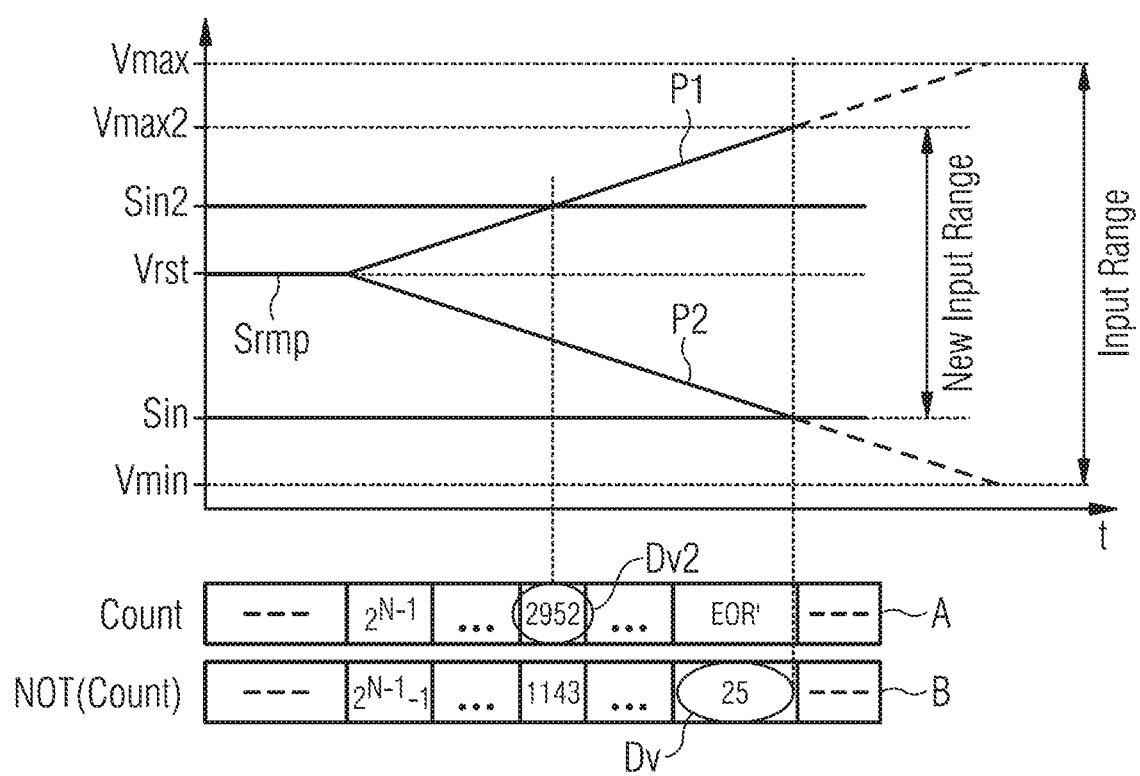

ANALOG-TO-DIGITAL CONVERTER CIRCUIT AND METHOD FOR ANALOG-TO-DIGITAL CONVERSION

The disclosure is directed to an analog-to-digital converter circuit and a method for analog-to-digital conversion.

The field of this disclosure concerns analog-to-digital converters, ADCs, especially, ADCs using a ramp signal for the conversion. Such converters are called ramp ADCs.

BACKGROUND

ADCs are widely used in image sensors, for example image sensors implemented in complementary metal-oxide-semiconductor, CMOS, technology. One known type of ADC in image sensors is a ramp ADC which is generally employed in CMOS image sensors due to its compact size and simplicity, allowing to easily perform multiple conversions in parallel. Image sensors comprise an array of unit elements, called pixels. The array of pixels is exposed to radiation during an exposure period and, subsequently, the signal value of each pixel is read from the array.

Pixel signals are analog signals. An ADC is provided to convert the analog pixel signal into a digital value. The ADCs are a major building block in image sensors and are often the bottleneck in the readout block of the image sensor in terms of frame rate, dynamic range and power consumption. Various arrangements have been proposed where analog-to-digital conversion is performed in parallel for analog signal values read from columns of an array. To avoid various column-to-column non-uniformities, all column ADCs share the same ramp voltage or ramp signal generated by a ramp generator. This helps to increase the speed at which the pixel array can be read. Therefore, these ADCs are typically used in a column of pixels for the conversion of a full row of pixels within a single conversion cycle.

One problem with existing ramp ADCs is their slow conversion time, i.e. long conversion cycle. The conversion cycle generally refers to the time needed for an ADC to provide a digital output equivalent to an analog input. A conversion with the resolution of N bits performed by a state of the art converter typically requires 2 to the power of N clock cycles of the clock used within the converter.

Each time a conversion is performed, the ramp signal used in state of the art ADCs must be reset to a well-defined value, corresponding to one of the limits of an ADC's input swing. With the ever increasing speed of the ramp ADCs, this ramp-reset time is becoming an important fraction of the total conversion time. Furthermore, as the trend in imaging is towards higher resolution, dead time caused by the ramp reset becomes even larger as the ramp generator's load increases proportionally to the number of columns of the array.

When choosing an ADC, there is always a trade-off between factors such as resolution, speed and accuracy. For CMOS image sensors, an accurate ADC is mandatory, otherwise the added error will increase the overall image noise. Removing accuracy from the equation, the need for a compromise between speed and resolution still remains and, consequently, an equilibrium between frame rate and color depth. Other factors such as area and power consumption can also be important.

Due to the accuracy requirement, a state of the art ADC typically used in CMOS image sensors usually performs slow conversions. Presently, one of the big challenges for CMOS image sensors design is the improvement of conversion time in order to achieve more frames per second or higher resolutions without neglecting accuracy.

The definitions as described above also apply to the following description unless stated otherwise.

SUMMARY

In one embodiment an analog-to-digital converter circuit has an input for receiving at least a first analog signal level, a ramp generator, a comparison unit, a counter and a control unit. The ramp generator is adapted to provide a ramp signal. The ramp signal has a constant and adjustable starting level which splits into a first section which is rising, and a second section which is falling concurrently to the first section's rising. The starting level of the ramp signal lies within an input range of the analog-to-digital converter circuit. The comparison unit is coupled by its first input to the input of the analog-to-digital converter circuit and is further coupled by its second input in a switchable manner to the ramp generator. The counter is coupled to the control unit. The control unit is coupled to an output of the comparison unit. The control unit is prepared to enable the counter depending on a comparison of the ramp signal with at least the first analog signal level and to determine a digital value as a function of a count of the counter reached at an intersection point of the ramp signal with at least the first analog signal level.

The comparison unit is configured to compare the ramp signal with the first analog signal level and to provide therefrom a comparison output to the control unit. The control unit activates the counter depending on said comparison output and determines the digital value which corresponds to the first analog signal level as a function of the count of the counter which has been reached at the intersection point of the ramp signal with the at least first analog signal level.

By the special shape of the ramp signal generated by the ramp generator, the time needed for a conversion of the first analog signal level into the digital value is greatly reduced. When compared with state of the art ramp ADCs, the digital value is determined and provided in half time but with the same resolution. Conversion speed is greatly improved.

Due to its shape the presently defined ramp signal having a constant and adjustable starting level which splits or forks into the first and the second sections, said ramp signal may also be denoted as a dual slope ramp with common reset. First and second sections represent the dual slope, while the starting level is called the common reset.

The first analog signal level comprises for instance a pixel signal of an image sensor.

The count reached by the counter is represented by a number between zero and two to the power of N minus 1 denoted $2^N-1$, wherein N refers to a resolution of the ADC circuit generally given in bits.

The intersection point of the ramp signal with the at least first analog signal level refers to the point where the ramp signal, especially either its first section or its second section, reaches the level of the first analog signal level.

In a development, the counter is configured to count in one direction only starting from the middle of its predefined digital scale.

The predefined digital scale of the counter represents a digital output scale of the ADC circuit. The digital scale is predefined by the resolution which is to be achieved by the ADC circuit. If the resolution amounts to N bits, the digital scale ranges from zero to $2^N-1$. Due to the counter's configuration to start counting from the middle of the predefined digital scale, the counter only needs to count half the scale amounting to 2 to the power of N−1 counts or codes instead of 2 to the power of N codes amounting to the full scale as of state of the art ramp ADCs. The other half of the scale is covered by a logical correlation within the defined ADC circuit.

In other words, the ADC circuit generates the ramp signal with two simultaneous slopes, i.e. the first section and the second section, which are moving away from a common point, denoted the constant and adjustable starting level on the analog domain. The starting level may also be denoted as the reset point. Said starting level is located within the input range of the ADC circuit, for example, for a fully linear scale at the middle of the ADC input range. By this, each section of the ramp signal covers half of the input range and due to the concurrency of first and second section, the input range of the ADC circuit is fully covered in half the time when compared with a state of the art single slope ramp ADC known to those skilled in the art. First and second sections of the ramp signal correlate with a first and a second half of the digital output scale. Consequently, the time needed for a conversion, i.e. for determining the digital output value is reduced to half the time.

The counter is configured to either count upwards starting from the middle of the predefined digital scale by increasing the count. Alternatively, the counter is configured to count downwards starting from the middle of the predefined digital scale by decreasing the count.

In a further development, the control unit is adapted to control operation of the analog-to-digital converter circuit during a conversion cycle comprising a ramp selection phase, a counting phase and a reset phase.

The control unit controls the operation of the ADC circuit using at least one control signal which controls the ramp generator, the comparison unit and the counter, respectively, and switchable connections within the ADC circuit. A switchable connection refers to a connection between two components of a circuit which is realized by a switch. A switch is implemented by a transistor or a transmission gate, for example.

In a development, the control unit comprises a configuration unit and an inversion unit. The configuration unit is adapted to provide a configuration signal depending on a comparison of the constant and adjustable starting level of the ramp signal with at least the first analog signal level during the ramp selection phase. The inversion unit is coupled in a switchable manner to at least one output of the counter and during the counting phase is prepared to provide the count directly or in its inverted form depending on the configuration signal.

During the ramp selection phase of a conversion cycle the ramp signal assumes its constant and adjustable starting level. During said phase the configuration unit provides the configuration signal depending on the comparison of the starting level of the ramp signal with the first analog signal level. The configuration signal therefore reflects the result of a rough comparison between the first analog signal level at the input of the ADC circuit and the starting level of the ramp signal. Through the configuration signal, either the first section or the second section of the ramp signal is used in a comparison in the subsequent counting phase. The counter is enabled as soon as the ramp signal splits into the first and the second section. This marks the beginning of the counting phase. By the configuration signal the provided count is directly used in the determination of the digital output value or the count is inverted and used in its inverted form to determine the digital output value.

The configuration unit is prepared to provide the configuration signal once in a conversion cycle, i.e. during the ramp selection phase.

The configuration signal represents an example of the control signal generated by the control unit. In the case that the counter is configured to count upwards and the first section of the ramp is used in a comparison, the count is used directly as the digital value. In the case that the counter is configured to count upwards and the second section is used in the comparison, the count is used in its inverted form.

In a development, the ramp generator comprises a first capacitor, a second capacitor, a first current generating unit and a second current generating unit. The first capacitor is coupled in a switchable manner under control of the control unit to an output of the first current generating unit and the second capacitor is coupled in a switchable manner under control of the control unit to an output of the second current generating unit. The first capacitor is connected in a switchable manner under control of the control unit to the second capacitor. The first current generating unit is configured to provide a positive charging current having an adjustable level at its output in order to generate the first section of the ramp signal in cooperation with the first capacitor. The second current generating unit is configured to provide a negative charging current having an adjustable level at its output in order to generate the second section of the ramp signal in cooperation with the second capacitor.

The first current generating unit generates the positive charging current with an adjustable level. The positive charging current is provided to the first capacitor and under control of the control unit the first section of the ramp signal is thus generated. The second current generating unit generates the negative charging current with an adjustable level which is provided to the second capacitor. Thus, under the control of the control unit the second section of the ramp signal is generated.

In an example implementation capacitance values of first and second capacitances are adapted to each other.

In an example, first and second current generating units are implemented by at least one current source and current mirrors. Alternatively, first and second current generating units are realized by voltage integrators.

In a development, the ramp generator further comprises a buffer component with an output for providing a reset signal having a constant and adjustable level. The output of the buffer component is connected in a switchable manner under control of the control unit to the first and to the second capacitor in order to generate the starting level of the ramp signal during the reset phase and the ramp selection phase.

During the reset phase, the ramp signal is reset to its constant starting level. For this purpose, first and second capacitors are directly connected so that a charge transfer occurs between both capacitors until an equilibrium point. Next, the buffer component is connected to a connection point between first and second capacitor, in order to ensure that said connection point assumes the starting level of the ramp signal. The level of the reset signal provided by the buffer component is adjusted to the starting level of the ramp signal. The buffer component ensures that the starting level of the ramp signal does not oscillate between different conversion cycles.

The described way of resetting the ramp signal to its constant starting level achieves a reduction in power consumption when compared with a state of the art single slope ramp ADC. As a single slope ramp increases from the lowest to the highest value of the input range of an ADC, during reset of the ramp it is necessary to discharge the ramp to the lowest value for performing the next conversion. For this purpose usually strong buffers are needed causing considerable current consumption, especially during a ramp reset. In the proposed ADC circuit, using the ramp signal with first and second sections, the reset can be partially performed by transferring charge between first and second capacitors, also called ramp capacitors, such that the current consumption peak is much smaller than in state of the art single slope ADCs.

As both sections of the ramp signal, i.e. first section and second section, start from a common point, there is no risk of discontinuities occurring during conversion. In an example implementation the starting level of the ramp signal is adjusted to the middle of the input range of the ADC circuit and first and second sections are generated with substantially the same slope. Reset of the ramp signal in this case can be called a self-reset. Since the first and second section of the ramp signal are generated by charging or discharging the first or the second capacitor and as the slope of both sections is symmetrical, both sections are at the same distance from the starting level of the ramp signal at the end of a counting phase.

By optimizing the reset of the ramp signal as described above, time for resetting is saved when compared to state of the art ADCs. Consequently, a conversion cycle is shorter.

In one embodiment an image sensor has a pixel array and at least one ADC circuit as defined above. The ADC circuit is employed in a column parallel topology.

The pixel array may have one pixel or one times K pixels or L times K pixels. The pixels are arranged in columns. In the column parallel topology the ramp signal is shared by all columns while several analog-to-digital conversions are completed simultaneously.

Due to improvement in conversion speed achieved with the specified ADC circuit, the image sensor is enabled to realize a higher frame rate.

In one embodiment a method for analog to digital conversion comprises the following steps:
receiving at least a first analog signal level,
generating a ramp signal having a constant and adjustable starting level which splits into a first section which is rising and a second section which is falling concurrently to the first section's rising, wherein the starting level lies within an input range of the analog-to-digital converter circuit,
comparing at least the first analog signal level with the ramp signal,
enabling a counting in function of the comparing of the ramp signal with the at least first analog signal level, and
determining a digital value as a function of a count reached at an intersection point of the ramp signal with at least the first analog signal level.

By employing the ramp signal defined above in the analog-to-digital conversion, an improvement on conversion speed/resolution ratio is achieved. The method allows to increase the frame rate of an image sensor without losing resolution or it allows to increase resolution without compromising frame rate.

The method described herein is implemented by the ADC circuit described above in one example implementation.

In a development the conversion is performed during a conversion cycle which comprises a ramp selection phase, a counting phase, and a reset phase.

In a further development, during the reset phase the ramp signal assumes its constant and adjustable starting level. During the ramp selection phase the at least first analog signal level is compared to the starting level of the ramp signal and a configuration signal is generated accordingly for selecting the first or the second section of the ramp signal in the subsequent counting phase. During the counting phase the ramp signal splits into the first and the second section. One of the first section and the second section is used for comparing at least the first analog signal level with the ramp signal depending on the configuration signal generated during the precedent ramp selection phase.

During one conversion cycle, the digital value corresponding to the first analog signal level is determined. For this purpose, in the ramp selection phase the first analog signal is roughly compared to the starting level of the ramp signal in order to decide which of the sections, either the first or the second section, to be generated during the subsequent counting phase is to be used for the comparison during the counting phase. For example, if the first analog signal level lies above the constant starting level of the ramp signal, the first section shall be used during the counting phase. If the analog signal level lies below the starting level of the ramp signal, the second section of the ramp signal shall be used in the subsequent counting phase. The configuration signal is generated to indicate this selection. No matter which one of the first or the second section of the ramp signal is used, both sections are generated during the counting phase. Only one of said sections of the ramp signal is used in the counting phase for the comparison with the first analog signal level as indicated by the configuration signal. The counting phase ends as soon as the first section of the ramp signal reaches the highest level of the ADC's input range and the second section reaches the lowest level of the ADC's input range. In the subsequent reset phase, the ramp signal is reset to its starting level.

Power consumption and time spent during the reset phase is greatly reduced when compared to state of the art ramp analog-to-digital conversions due to the fact that at the end of the counting phase both sections of the ramp signal are at a similar distance from the starting level and only have to be reset to said starting level.

In a development depending on the configuration signal generated during the ramp selection phase, either the count reached at an intersection point of the ramp signal with at least the first analog signal is determined as the digital value, or an inverted form of the count reached at an intersection point of the ramp signal with at least the first analog signal level is determined as the digital value.

In a development the counting starts from the middle of the predefined digital scale and is effected by counting upwards until the highest value of the digital scale or by counting downwards until the lowest value of the digital scale.

As detailed above, the counting is effected in one direction only.

In a development the generation of the ramp signal is effected such that the starting level of the ramp signal is adjusted to the middle of the input range of the ADC circuit and the first section's rising is mirror-symmetric to the second section's falling. Therein the starting level represents the axis of symmetry.

In this development the first and second sections have substantially the same gradient or slope.

In an alternative development the generation of the ramp signal is effected such that the first section is rising according to a first adjustable gradient and the second section is falling according to a second adjustable gradient.

According to said alternative development, the ramp signal has two different slopes when splitting from the starting level. The steepness or gradient of the first and second sections is adjusted, for example depending on the level of the first analog signal level. Thereby, a flexible signal-dependent steepness of the ramp signal is enabled. In this way, the influence of photon shot noise is mitigated.

BRIEF DESCRIPTION OF THE DRAWINGS

The text below explains the proposed ADC circuit and corresponding method in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures.

FIG. 10 shows a correlated double-sampling conversion using the proposed ADC converter and method.

is based on the depicted ramp signal Srmp. At point-in-time t2 the reset phase Phc starts in which the first section P1 and the second section P2 of the ramp Srmp resume the constant starting level Vrst.

The ramp signal Srmp is implemented, for example, by a voltage. Consequently, the starting level Vrst, the minimum level V min and the maximum level V max each represent a voltage level.

After the ramp signal Srmp has reached its starting level Vrst in the reset phase Phc, the next conversion cycle can be started with the next ramp selection phase Pha.

Figure 1:
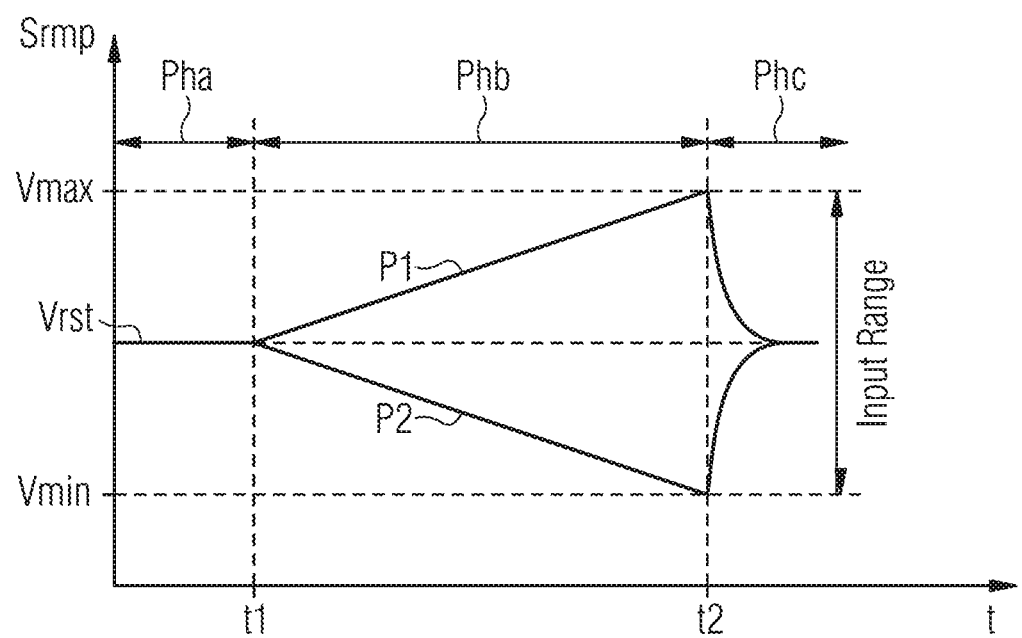
FIG. 1 shows an embodiment example of a ramp signal as proposed to be used in the proposed ADC circuit.

Beneath the illustration of the ramp signal Srmp FIG. 1 shows counts of a counter of the proposed ADC circuit. Therein, counts corresponding to the first section P1 are presented in line A and inverted counts denoted "NOT (Count)" of the counter corresponding to the second section P2 are presented in line B. As explained above, the ADC circuit has a resolution of N bits. The total scale of the counter consequently ranges from zero to the highest code denoted "end of range" or "EOR", here $2^N-1$. As defined above, the counter starts at the middle of its digital scale, i.e. at count $2^{(N-1)}$, which corresponds to the analog starting level Vrst of the ramp signal Srmp. For the rising section P1 the counts are increased until the highest code EOR at point-in-time t2. The inverted counts on line B corresponding to the falling section P2 of the ramp signal Srmp are determined by a logical NOT operation to the counts of line A, as the counter is configured to count upwards.

From analyzing the digital scale of the counter employed in the ADC circuit, it can be seen that the first and the last code are correlated by the logical NOT operation or inversion. The same correlation exists between the second and the penultimate code, between the third and the third-last code and so on, until the middle of the scale, as illustrated in Table 1.

TABLE 1

| First Half of Scale | | | Second Half of Scale | |
|---|---|---|---|---|
| Decimal | Binary | | Binary | Decimal |
| 0 | 0000 0000 0000 | | 1111 1111 1111 | $4095_{(2^N-1=EOR)}$ |
| 1 | 0000 0000 0001 | | 1111 1111 1110 | 4094 |
| 2 | 0000 0000 0010 | | 1111 1111 1101 | 4093 |
| ... | ... | Logical NOT | ... | ... |
| 2046 | 0111 1111 1110 | | 1000 0000 0001 | 2049 |
| 2047 | 0111 1111 1111 | | 1000 0000 0000 | $2048_{(2^{N-1})}$ |

DETAILED DESCRIPTION

FIG. 1 shows an embodiment example of a ramp signal as proposed to be used in the proposed ADC circuit. The ramp signal Srmp is depicted in relation to time t. A full conversion cycle of the ramp signal Srmp is illustrated having a ramp selection phase Pha, a counting phase Phb, and a reset phase Phc. During the ramp selection phase Pha the ramp signal Srmp is at its constant start level Vrst. At point-in-time t1 the counting phase Phb starts and the ramp signal Srmp splits into a first section P1 and a second section P2. It can be discerned that the first section P1 is rising, while the second section P2 is falling. At a point-in-time t2 the first section P1 of the ramp signal Srmp has reached a maximum level V max, while the second section P2 of the ramp signal Srmp has reached a minimum level V min. The region between the minimum level V min and the maximum level V max represents an input range of the ADC circuit which By employing the ramp signal Srmp as depicted in FIG. 1, the logical correlation from Table 1 is transposed to the analog domain of the analog input signal and the analog ramp signal Srmp.

Figure 2:
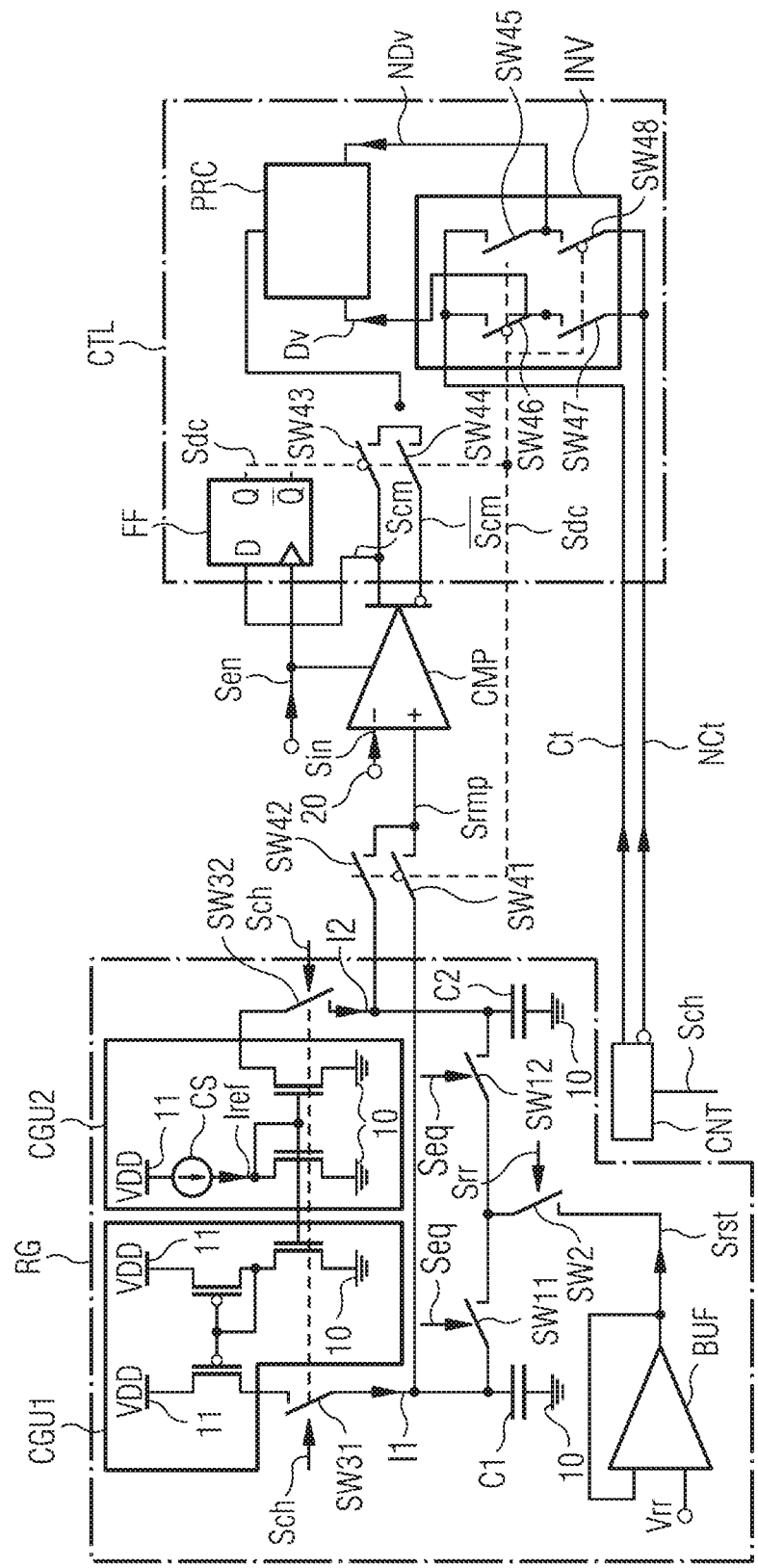
FIG. 2 shows an embodiment example of an ADC circuit as proposed.

FIG. 2 shows an embodiment example of an analog-to-digital converter circuit as proposed. The ADC circuit comprises an input 20 for receiving at least a first analog signal level Sin. The ADC circuit further comprises a ramp generator RG which is adapted to provide the ramp signal Srmp, a comparison unit CMP, a counter CNT and a control unit CTL. The first analog signal level Sin is provided to a first input of the comparison unit CMP. A second input of the comparison unit CMP is coupled in a switchable manner to an output of the ramp generator RG for receiving the ramp signal Srmp. One output of the comparison unit CMP is coupled to the control unit CTL. At the output of the comparison unit CMP a comparison signal Scm is provided which is a function of a comparison between the analog signal level Sin and the ramp signal Srmp.

In the depicted example the comparison unit CMP is implemented by an operational amplifier having the output at which the comparison signal Scm is provided and an inverted output at which an inverted comparison signal $\overline{Scm}$ is provided.

The counter CNT is coupled to the control unit CTL and is enabled by a charging signal Sch. The control unit CTL comprises a configuration unit FF and an inversion unit INV. The configuration unit FF is configured to provide a configuration signal Sdc depending on a comparison of the constant and adjustable starting level Vrst of the ramp signal Srmp with the first analog signal level Sin during the ramp selection phase. The inversion unit INV is coupled in a switchable manner to at least one output of the counter CNT and is prepared to provide the count directly or in its inverted form depending on the configuration signal Sdc during the counting phase.

In the depicted example the configuration unit FF is realized by a flip-flop, especially by a D-flip-flop. The D-input of the configuration unit FF receives the comparison signal Scm. A clock input of the configuration unit FF receives an enable signal Sen. At a Q output of the configuration unit FF the configuration signal Sdc is provided as described above.

In this example the inversion unit INV is realized by a full bridge comprising switches SW45, SW46, SW47 and SW48. Switches SW45 and SW47 are each controlled by the configuration signal Sdc. Switches Sw46 and Sw48 are controlled by the configuration signal Sdc in its inverted form as indicated by empty circuits next to respective control inputs of said switches signifying a logical inversion or NOT operation of the provided configuration signal Sdc. The full bridge of the inversion unit INV receives the count Ct and the inverted count NCt from the counter CNT at its inputs. Depending on the configuration signal Sdc and the corresponding configuration of the switches, the count Ct or the inverted count NCt is provided as digital value Dv at an output of the inversion unit INV. Optionally, the inversion unit INV has a second output for providing an inverted digital value NDv which corresponds to the digital value Dv in its inverted form.

In the depicted example the control unit CTL further comprises a processing subunit PRC. The processing subunit PRC is connected in a switchable manner to the outputs of the comparison unit CMP, i.e. switch SW43 which is controlled by the configuration signal Sdc connects the positive output of the comparison unit CMP to the processing subunit PRC, while switch SW44 which is controlled by the inverted configuration signal Sdc connects the negative output of the comparison unit CMP to the processing subunit PRC. The processing subunit PRC is further connected to the output of the inversion unit INV at which the digital value Dv is provided. Optionally, the processing subunit PRC is further connected to the second output of the inversion unit INV at which the inverted digital value NDv is provided. The processing subunit PRC has a storage for storing the determined digital value Dv in each conversion cycle. Storing of the digital value Dv is enabled by the comparison signal Scm.

The ramp generator RG comprises a first capacitor C1, a second capacitor C2, a first current generating unit CGU1 and a second current generating unit CGU2. An output of the first current generating unit CGU1 is coupled to a first terminal of the first capacitor C1 using switch SW31. A second terminal of the first capacitor C1 is coupled to a reference potential terminal 10. The first current generating unit CGU1 is configured to provide a positive charging current I1 to the first capacitor C1. An output of the second current generating unit CGU2 is coupled by switch SW32 to a first terminal of the second capacitor C2. A second terminal of the second capacitor C2 is connected to the reference potential terminal 10. The second current generating unit CGU2 is configured to provide a negative charging current I2 at its output. The first terminal of the first capacitor C1 is coupled to the first terminal of the second capacitor C2 using switches SW11 and SW12 which are operated concurrently under control of an equalize signal Seq provided by the control unit CTL.

The second current generating unit CGU2 comprises a current source CS for providing a reference current Iref and a current mirror. The current source CS is coupled to a supply potential terminal 11 providing, for example, supply potential VDD and to an input of the current mirror. Instead of potential VDD another potential which enables the intended reference current Iref can be used as known to those skilled in the art. An output of the current mirror forms an output of the second current generating unit CGU2. The first current generating unit CGU1 also comprises a current mirror. An input of the first current generating unit CGU1 is coupled to the second current generating unit CGU2. It receives an input current which is a function of the reference current Iref. An output of the current mirror forms an output of the first current generating unit CGU1. The current mirror of the first current generating unit CGU1 is realized, for example by PMOS transistors as depicted in FIG. 2. The current mirror of the second current generating unit CGU2 is implemented for example by NMOS transistors as depicted in FIG. 2. A level of the positive charging current I1 can therefore be adjusted by adjusting the level of the reference current Iref and a ratio realized by the current mirror of the first current generating unit CGU1. A level of the negative charging current I2 can be adjusted by adjusting the level of the reference current Iref and the ratio of the current mirror of the second current generating unit CGU2. The positive charging current I1 is provided to the first terminal of the first capacitor C1 through switch SW31 which is controlled by the charging signal Sch provided by the control unit CTL. The negative charging current I2 is provided to the first terminal of the second capacitor C2 through a switch SW32 which is controlled by the charging signal Sch.

The ramp generator RG additionally comprises a buffer component BUF. The buffer component BUF has an input for receiving a ramp reset level Vrr and an output for providing a reset signal Srst as a function of the ramp reset level Vrr. In the depicted example the buffer component BUF is realized by an operational amplifier configured in unity feedback. The output of the buffer component BUF is coupled by switch SW2 to the first terminals of first and second capacitors C1, C2. Switch SW2 is controlled by a ramp reset signal Srr which is provided by the control unit CTL.

A connection point between the output of the first current generating unit CGU1 and the first terminal of the first capacitor C1 forms a first output of the ramp generator RG. A connection point between the output of the second current generating unit CGU2 and the first terminal of the second capacitor C2 forms a second output of the ramp generator RG. The first output is coupled to the second input of the comparison unit CMP by switch SW41. The second output of the ramp generator RG is coupled to the second input of the comparison unit CMP by switch SW42. Switch SW42 is controlled by the configuration signal Sdc, while switch SW41 is controlled by the configuration signal Sdc in its inverted form, such that either switch SW42 or switch SW41 is closed.

At the first output of the ramp generator RG, the first section P1 of the ramp signal Srmp is provided due to the charging of the first capacitor C1 by the positive charging current I1. At the second output of the ramp generator RG, the second section P2 of the ramp signal Srmp is provided due to the discharging of the second capacitor C2 using the negative charging current I2. Under control of the configuration signal Sdc either the first section P1 or the second section P2 of the ramp signal Srmp is supplied to the second input of the comparison unit CMP during the counting phase.

Detailed functioning of the circuit depicted in FIG. 2 is described with reference to FIG. 3.

In the case that the proposed ADC circuit of FIG. 2 is used in an image sensor in a column parallel topology, the ramp generator RG and the counter CNT are shared between all the columns of a pixel array within the image sensor. Each column needs a separate comparison unit CMP and a separate control unit CTL.

The control unit CTL has components for generating the equalize signal Seq, the enable signal Sen, the charging signal Sch, and the ramp reset signal Srr. Generation of said control signals is implemented, for example in the processing subunit PRC.

Figure 3:
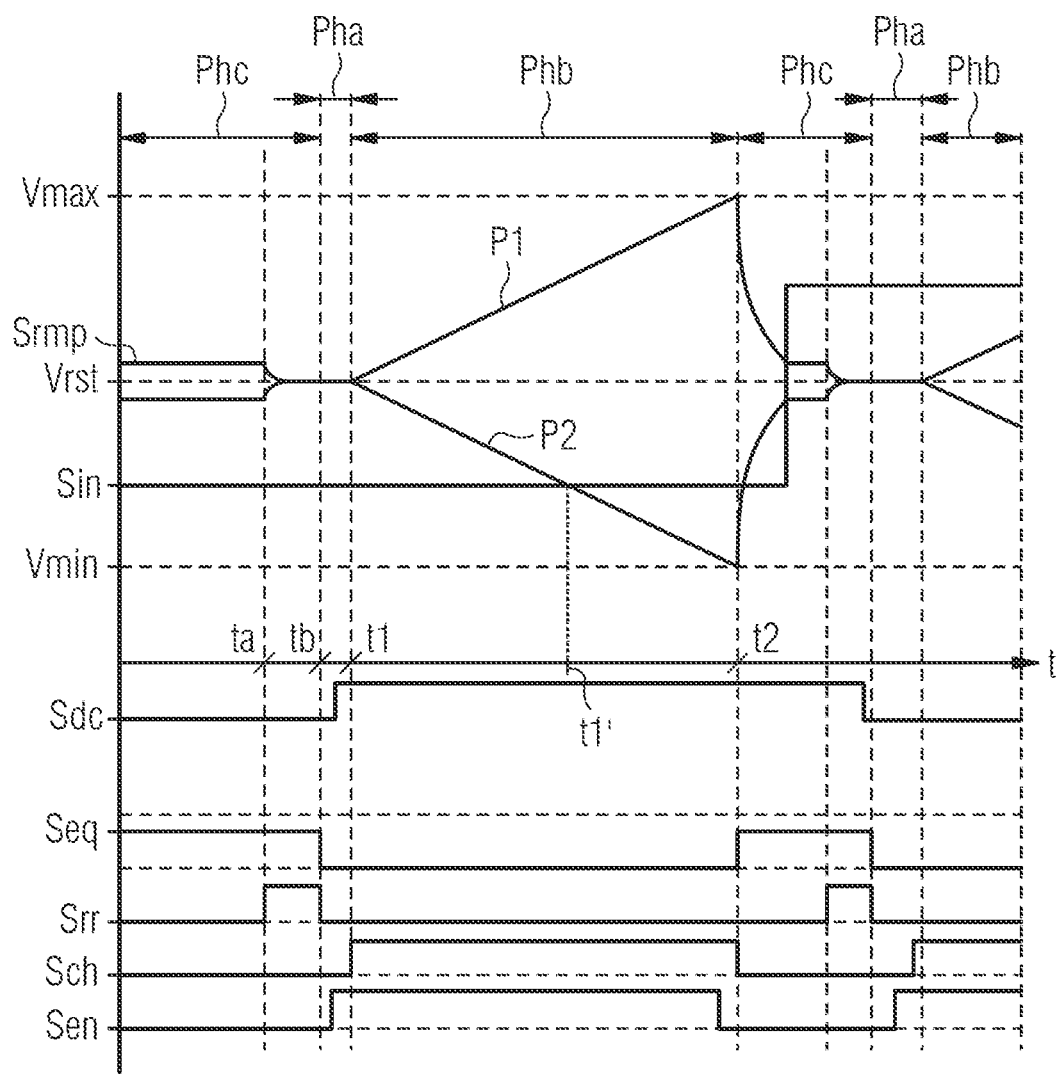
FIG. 3 shows timing diagram examples for the ADC circuit as of FIG. 2.

FIG. 3 shows timing diagram examples for the ADC circuit as of FIG. 2. From top to bottom, different signals are depicted with relation to time t. First, the ramp signal Srmp is shown with the constant starting level Vrst and first and second sections P1, P2. The first analog signal level Sin is presented beneath the ramp signal Srmp. The next line shows the configuration signal Sdc below which the equalize signal Seq is depicted. The next line shows the ramp reset signal Srr followed by the charging signal Sch. The bottom line shows the enable signal Sen.

As indicated at the top one and a half conversion cycles are shown wherein each conversion cycle has a reset phase Phc, a ramp selection phase Pha and a counting phase Phb. A conversion cycle either begins or ends with the reset phase Phc. In the depicted example a conversion cycle begins with a reset phase Phc. During the first conversion cycle the analog signal level Sin lies below the starting level Vrst of the ramp signal Srmp. The signals below the time line are digital signals, in particular binary signals, having two logical levels.

In a first part of the reset phase Phc of the first conversion cycle, switches SW11 and SW12 are closed by way of the equalize signal Seq. Charge is transferred from the first capacitor C1 to the second capacitor C2 until an equilibrium point is reached. As soon as the ramp reset signal Srr goes to a logical high at point-in-time to switch SW2 is closed and the output of the buffer component BUF is connected to the connection point between first and second capacitors C1, C2. By this, the ramp signal Srmp is forced to assume its starting level Vrst. By this, the offset between first and second capacitor C1 and C2 is removed and the starting level Vrst of the ramp signal is maintained unchanged between different conversion cycles. At point-in-time tb the equalize signal Seq and the ramp reset signal Srr go back to logical low and switches SW11, SW12 and SW2 are opened. The ramp selection phase Pha starts. During this phase, the enable signal Sen goes to logical high such that the comparison unit CMP and the configuration unit FF are activated. One of the switches SW41 or SW42 is closed from a previous conversion cycle, thereby connecting either the potential at the first terminal of the first capacitor C1 or the potential at the first terminal of the second capacitor C2 to the second input of the comparison unit CMP. Both potentials are at the same level during the ramp selection phase Pha. Consequently, the starting level Vrst of the ramp signal Srmp is compared with the first analog signal level Sin. As the level of the first analog signal the level Sin is below the starting level Vrst, the positive output of the comparison unit CMP goes to high which is reflected and stored at output Q of the flip-flop of the configuration unit FF. Consequently, the configuration signal Sdc goes to high which closes switch SW32 to provide the second section P2 to the second input of the comparison unit CMP. Furthermore, with the aid of the configuration signal Sdc switch SW44 is closed connecting the negative output of the comparison unit CMP to the control input of the processing subunit PRC. Within the inversion unit INV by way of the configuration signal Sdc switches SW45 and SW47 are closed such that the inverted count NCt of counter CNT is provided as the digital value Dv. This means that although counter CNT is prepared to only count upwards from the middle of the digital scale, decreasing counts are provided as the count.

Shortly after the configuration of the switches using the configuration signal Sdc is completed, at point-in-time t1 the charging signal Sch goes to logical high which closes switches SW31 and SW32 for providing the positive charging current I1 to the first capacitor C1 and the negative charging current I2 to the second capacitor C2. At point-in-time t1 the ramp signal Srmp consequently splits into the first section P1 and second section P2. At t1 the counting phase Phb starts and the counter CNT is activated.

As can be seen during the counting phase Phb of the first conversion cycle, both sections P1, P2 of the ramp signal Srmp are generated concurrently, while just the second section P2 is supplied to the comparison unit CMP. At point-in-time t1' the second section P2 of the ramp signal Srmp crosses the level of the first analog signal at level Sin. This changes the output of the comparison unit which enables storage of the digital value Dv reflecting the count Ct reached at point-in-time t1' within the processing subunit PRC. First and second sections P1, P2 of the ramp signal Srmp are generated until the end of the counting phase Phb when the maximum and the minimum level of the input range are reached at point-in-time t2.

At point-in-time t2 the next conversion cycle starts with a reset phase Phc in which the ramp signal Srmp is reset to its constant starting level Vrst.

Shortly before the end of the counting phase Phb the enable signal Sen assumes a logical zero which deactivates the comparison unit CMP and the configuration unit FF. At point-in-time t2 the charging signal Sch goes to zero which disconnects first and second current generating units CGU1, CGU2 from first and second capacitors C1, C2.

In the generation of the enable signal Sen response time of the comparison unit CMP is taken into account. In the example of FIG. 3 the starting level Vrst of the ramp signal Srmp coincides with the middle of the input range ranging from the maximum level V max to the minimum level V min. First and second sections P1, P2 are generated mirror-symmetric with respect to the starting level Vrst.

In an optimization when the ADC circuit is used in an image sensor in a column parallel topology, in order to keep the loads associated with each ramp independent from the input signal level a dummy comparator or a dummy input stage is additionally used in the circuit of FIG. 2. The unused section of the ramp signal is connected in this case to the dummy comparator for performance and linearity improvement.

The value of the starting level Vrst, the level of the reference current Iref and the end of the range of the digital scale of the counter are selected in consistency with the desired input range to be achieved by the ADC circuit.

In an alternative implementation of the ADC circuit the current source CS and the current mirrors of the first and the second current generating unit CGU1, CGU2 are replaced by respective voltage integrators. The remaining circuitry is consequently adapted as known to those skilled in the art.

Figure 4:
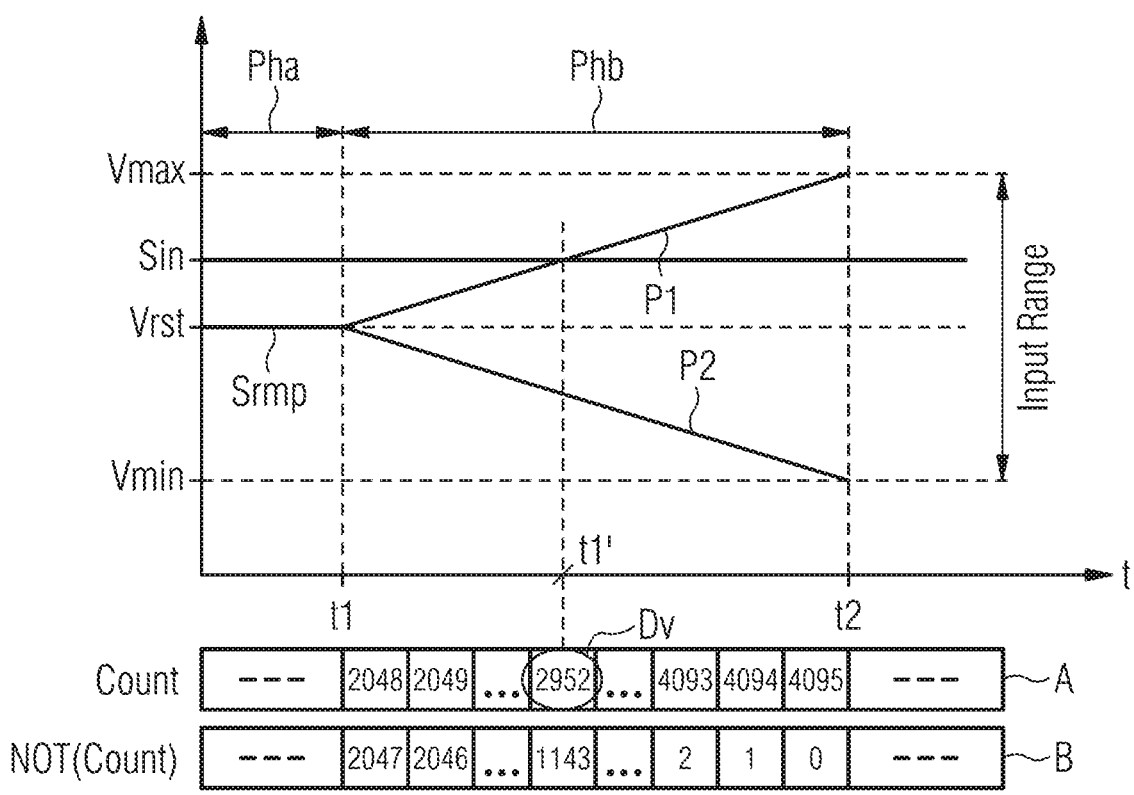
FIG. 4 shows a first example of an analog-to-digital conversion as proposed.

FIG. 4 shows a first example of an analog-to-digital conversion as proposed. In this example the ramp signal Srmp and the first analog signal level Sin are shown in relation to time t. Beneath the signal diagram corresponding counts are depicted. In this example the first analog signal level is higher than the starting level Vrst of the ramp signal Srmp. Accordingly, in the ramp selection phase Pha it is determined to use the first section P1 of the ramp signal Srmp in the subsequent counting phase Phb. During the counting phase Phb the counter counts upwards until the intersection point between the first section P1 of the ramp signal Srmp and the first analog signal level Sin at point-in-time t1'. At this point-in-time, the counter has reached a count of 2952 which is provided as the digital vale Dv of the conversion cycle.

Figure 5:
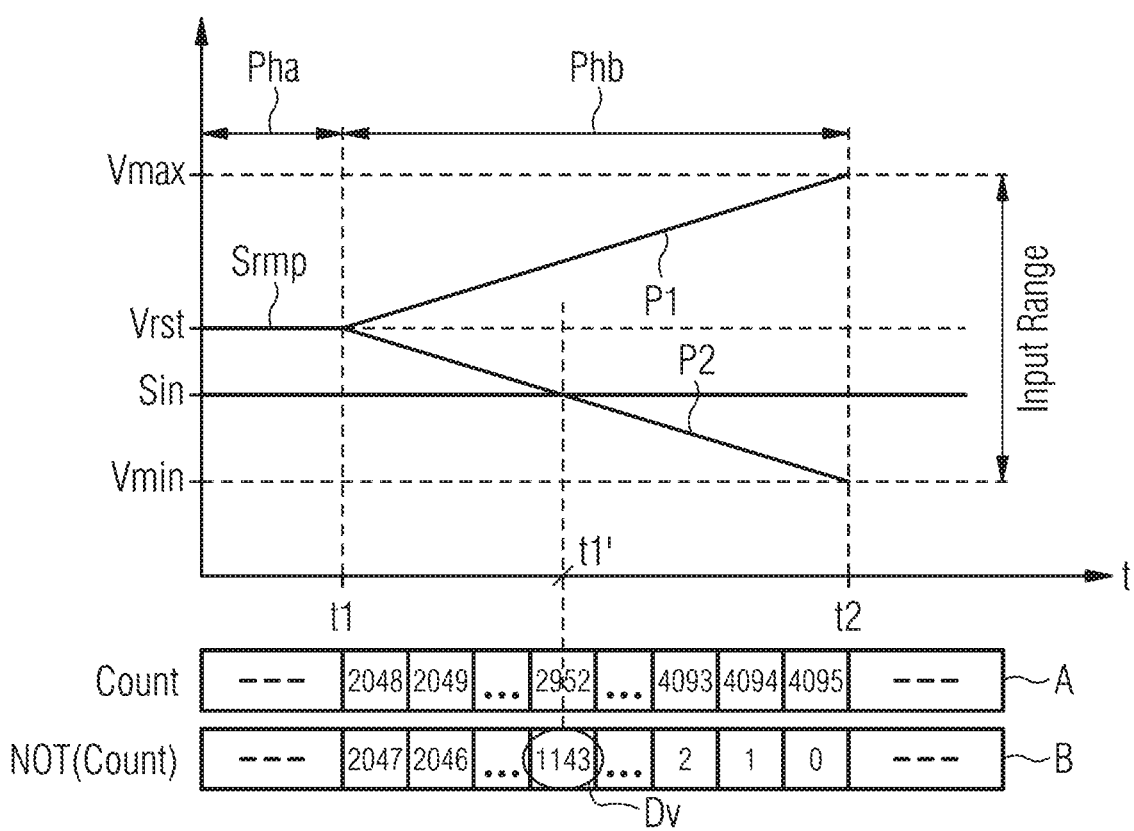
FIG. 5 shows a second example of an analog-to-digital conversion as proposed.

FIG. 5 shows a second example of a conversion as proposed. FIG. 5 coincides with the conversion of FIG. 4 with the exception that the first analog signal level Sin in this example is below the starting level Vrst of the ramp signal Srmp. Therefore, in the ramp selection phase Pha it is determined to use the second section P2 of the ramp signal Srmp in the subsequent counting phase Phb. Consequently, the count 2952 reached at point-in-time t1' where the second section P2 of the ramp signal Srmp crosses the first analog signal level Sin is used in its inverted form. Accordingly, the digital value Dv determined during the depicted conversion cycle amounts to 1143.

Figure 6:
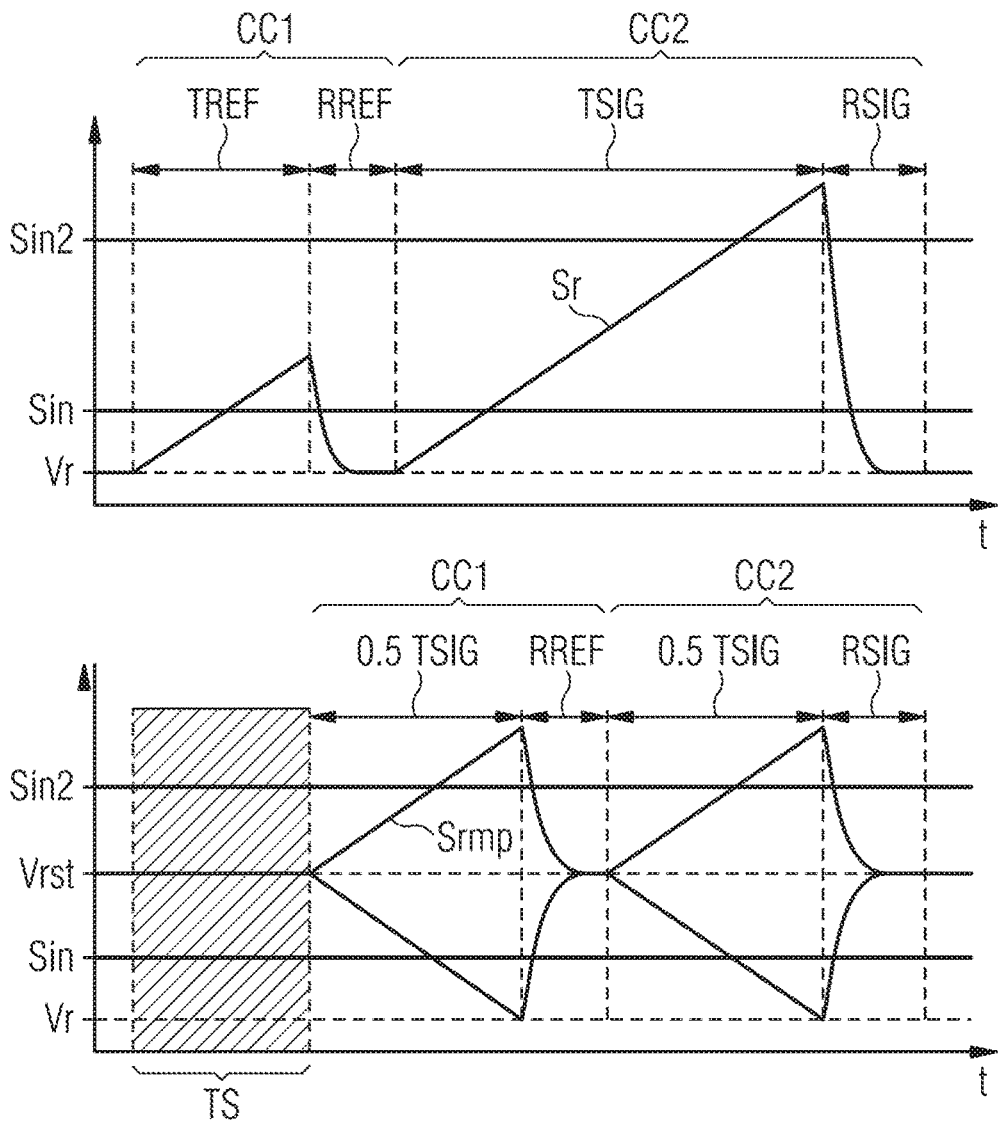
FIG. 6 shows a comparison with a state of the art ADC.

FIG. 6 shows a comparison between a state-of-the-art single slope ramp ADC and the proposed ADC circuit using a dual slope ramp. In the upper part of FIG. 6 a timing diagram corresponding to a state-of-the-art single slope ramp ADC is depicted, while in the bottom of FIG. 6 the timing of the proposed ADC circuit is shown. In both cases a first analog signal level Sin corresponding to a reference level of a pixel and subsequently a second analog signal level Sin 2 are converted in two consecutive conversion cycles CC1, CC2.

The upper diagram shows the course of a state-of-the-art single-slope ramp signal Sr with a reset level Vr and the course of the first analog signal level Sin, as well as the course of the second analog signal level Sin 2. It can be seen that in the first conversion cycle CC1 a first amount of time TREF is needed for conversion of the first analog signal level Sin. Subsequently, the amount of time RREF is spent on resetting the ramp Sr back to its reset level. In the second conversion cycle CC2 an amount of time TSIG is needed for conversion of the second analog signal level Sin 2. Subsequently, an amount of time RSIG is spent on resetting the ramp Sr back to its reset level.

The diagram below shows the course of the newly proposed ramp signal Srmp having the starting level Vrst and the course of first and second analog signal levels Sin, Sin 2. It can be seen that in the first conversion cycle CC1 only half the amount of time TSIG is spent in converting the first analog signal level Sin. Subsequently the ramp signal Srmp is reset to its starting level Vrst in the amount of time RREF. In the second conversion cycle CC2 for conversion of the second analog signal level Sin 2 again half the amount of time TSIG is spent. Subsequently, the ramp signal Srmp is reset to its starting level Vrst.

The comparison between the upper diagram and the lower diagram reveals that the amount of time TS is saved, which is depicted in the lower diagram by the hatched section. The proposed ADC converter and corresponding method for conversion therefore achieve an improvement with respect to conversion time when compared to state-of-the-art single-slope ADCs.

Figure 7:
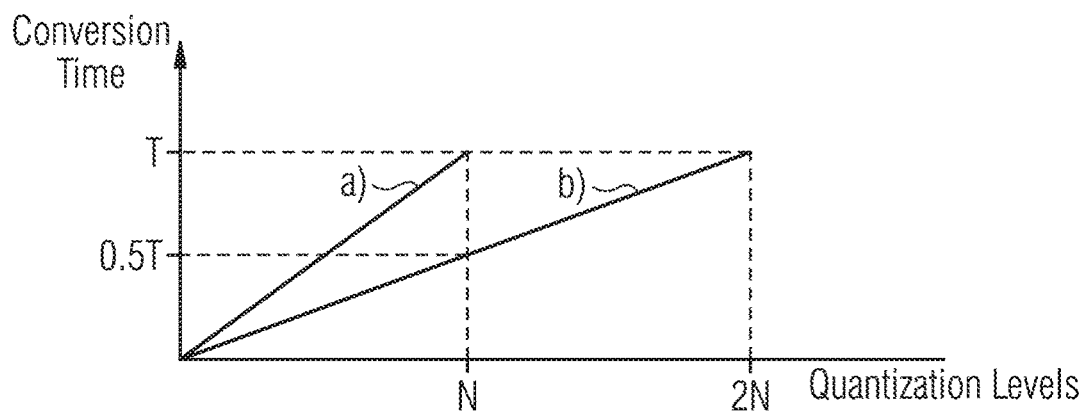
FIG. 7 shows another comparison with a state of the art ADC.

FIG. 7 shows another comparison between a state-of-the-art ADC and the proposed ADC circuit. Conversion time is depicted in relation to quantization levels. Line a) represents the speed resolution ratio of a state of the art ADC, while line b) represents the speed resolution ratio of the proposed ADC circuit.

For providing a resolution of N bits or N quantization levels, the state-of-the-art ADC needs the amount of time T. For providing the same resolution of quantization levels or bits, the proposed ADC circuit only needs half the amount of time T. Furthermore, if the proposed ADC circuit is given the full amount of time T for a conversion cycle, a resolution of two times N is achieved as can be seen from line b). The improvement of speed resolution ratio is clearly visible from FIG. 7.

Figure 8:
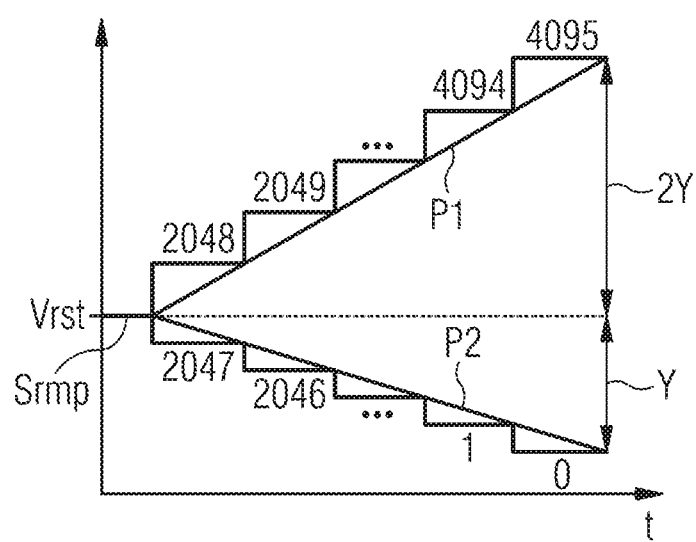
FIG. 8 shows an example of a ramp signal to be used in the proposed ADC circuit.

FIG. 8 shows an example of a ramp signal to be used in the proposed ADC circuit. In contrast to the fully linear scale used for the ramp signals, for instance of FIG. 5 described above, where the same absolute value of current is provided to the first and the second capacitors for generating symmetrical slopes, FIG. 8 is based on a dual step approach. This means that different absolute values of positive and negative charging currents are provided to the first and second capacitors for generating non-symmetrical slopes P1, P2 representing first and second section P1, P2 of the ramp signal Srmp. The rate of charge in the first section P1 differs from the rate of discharge in the second section P2 as indicated by the values "Y" and "2Y" reflecting the difference in gradient between first and second section P1, P2. Consequently, light-dependent slopes are achieved by the two sections P1, P2. In detail, for low light, the first section P1 with the smaller gradient is provided, while for high light the second section P2 with the higher gradient is generated. This allows to mitigate photon shot noise. The starting level Vrst provides a threshold for step changing. In other words, by adjusting the starting level Vrst, the level on the analog input range from which a step size of the ADC circuit is increased or decreased can be controlled.

Figure 9A:
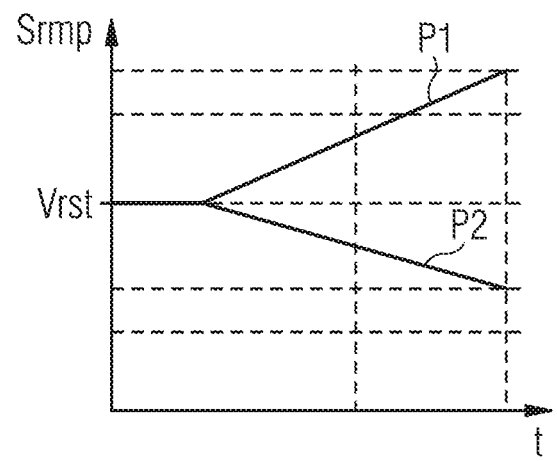
FIGS. 9A, 9B and 9C each show different shapes of ramp signals to be used in the proposed ADC circuit.
Figure 9B:
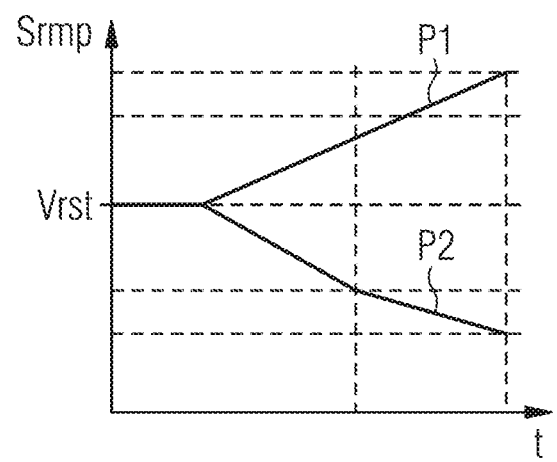
Figure 9C:
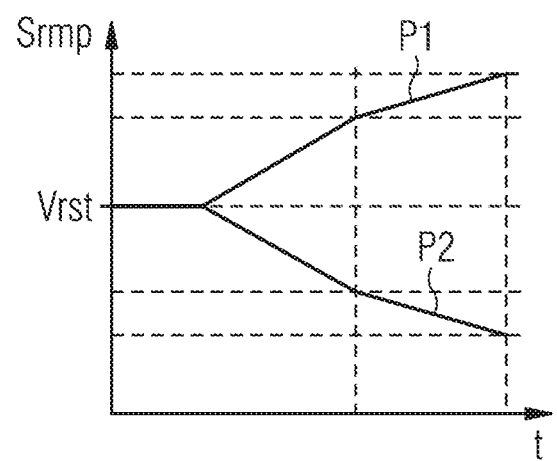

FIGS. 9A, 9B and 9C each show a different shape of the ramp signal to be used with the proposed ADC circuit, e.g. as of FIG. 2. In each case the course of the ramp signal Srmp is depicted with relation to time t. Each of the depicted shapes is based on a multi-step approach, meaning that different absolute values of positive and negative charging currents are provided to first and second capacitors for generating non-symmetrical first and second sections P1, P2 of the ramp signal Srmp with an additional change of charge and discharge rate during a conversion cycle. The starting level Vrst and the count provide the thresholds for step variation.

In order to realize the shapes of the ramp signals Srmp depicted in FIGS. 8A, 8B, 9A, 9B and 9C, it is necessary to adapt first and second current generating units as of FIG. 2. For example, the current mirrors of said current generating units shall be implemented with more branches and a corresponding logic to control these branches as known to those skilled in the art.

FIG. 10 shows a correlated double-sampling conversion using the proposed ADC converter. The course of the ramp signal Srmp, the first and the second analog signal levels Sin, Sin 2 are depicted in relation to time t. The first analog signal level Sin in this case again represents a reset or dark level of a pixel, while the second analog signal level Sin 2 represents the signal level of said pixel. Here, both values are converted in one conversion cycle. The second analog signal level Sin 2 is converted as described above. A corresponding digital value Dv2 is determined at count 2952 which is reached at the intersection point of the first section P1 of the ramp signal Srmp with the second analog signal level Sin 2. The counter continues counting unit 1 the intersection point of the second section P2 of the ramp signal Srmp with the first analog signal level Sin. The inverted count 25, representing the digital value Dv, is stored and the counter is stopped. Consequently, a new end of range EOR' is achieved shown in line A. This refers to a new input range from a new maximum level V max 2 to the first analog signal level Sin.

In order to implement the described correlated double-sampling in one conversion cycle, it is necessary to adapt the implementation of the comparison unit as of FIG. 2 by adding a second comparator for comparing the second analog signal level Sin 2 to the ramp signal Srmp. Furthermore, the counter has to be implemented as a local counter.

Although, the effective input range is limited to the new input range as indicated in FIG. 10, and some codes at the bottom and at the top of the scale will be missed, it is assumed that the reset level of a pixel is the lowest possible value, so that the lost codes have no significant impact on the dynamic range. Furthermore, in this case the codes which are missed at the top of the scale can be minimized with an efficient gain configuration and adequate starting level Vrst of the ramp signal Srmp. Consequently, the correlated double-sampling conversion can be simplified to a subtraction between the digital value Dv2 and the first digital value Dv in the digital domain.

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described above may also be employed without departing from the scope of the ADC circuit and corresponding method which are defined in the accompanying claims.

The invention claimed is:

1. An analog-to-digital converter circuit having
an input for receiving at least a first analog signal level,
a ramp generator adapted to provide a ramp signal having a constant and adjustable starting level which splits into a first section which is rising and a second section which is falling concurrently to the first section's rising, wherein the starting level lies within an input range of the analog-to-digital converter circuit,
a comparison unit which is coupled by its first input to the input of the analog-to-digital converter circuit and is coupled by its second input in a switchable manner to the ramp generator,
a counter which is coupled to a control unit, and
the control unit which is coupled to an output of the comparison unit,
wherein the control unit is prepared to enable the counter depending on a comparison of the ramp signal with at least the first analog signal level and to determine a digital value as a function of a count of the counter reached at an intersection point of the ramp signal with at least the first analog signal level,
wherein the ramp generator comprises a first capacitor, a second capacitor, a first current generating unit and a second current generating unit,
wherein the first capacitor is coupled in a switchable manner under control of the control unit to an output of the first current generating unit, and the second capacitor is coupled in a switchable manner under control of the control unit to an output of the second current generating unit,
wherein the first capacitor is connected in a switchable manner under control of the control unit to the second capacitor,
wherein the first current generating unit is configured to provide a positive charging current having an adjustable level at its output in order to generate the first section of the ramp signal in cooperation with the first capacitor, and
wherein the second current generating unit is configured to provide a negative charging current having an adjustable level at its output in order to generate the second section of the ramp signal in cooperation with the second capacitor.

2. The analog-to-digital converter circuit according to claim 1,
wherein the counter is configured to count in one direction only starting from a middle of its predefined digital scale.

3. The analog-to-digital converter circuit according to claim 1,
wherein the control unit is adapted to control operation of the analog-to-digital converter circuit during a conversion cycle comprising a ramp selection phase, a counting phase, and a reset phase.

4. The analog-to-digital converter circuit according to claim 3,
wherein the control unit comprises a configuration unit and an inversion unit,
wherein the configuration unit is adapted to provide a configuration signal depending on a comparison of the constant and adjustable starting level of the ramp signal with at least the first analog signal level during the ramp selection phase, and
wherein the inversion unit is coupled in a switchable manner to at least one output of the counter and during the counting phase is prepared to provide the count directly or in its inverted form depending on the configuration signal.

5. The analog-to-digital converter circuit according to claim 1,
wherein the ramp generator further comprises a buffer component with an output for providing a reset signal having a constant and adjustable level, the output of the buffer component being connected in a switchable manner under control of the control unit to the first and the second capacitor in order to generate the starting level of the ramp signal during the reset phase and the ramp selection phase.

6. An image sensor having a pixel array and at least one analog-to-digital converter circuit according to claim 1 in a column parallel topology.

7. A method for analog-to-digital conversion comprising the following steps:
  receiving at least the first analog signal level,
  generating the ramp signal having the constant and adjustable starting level which splits into the first section which is rising and the second section which is falling concurrently to the first section's rising, wherein the starting level lies within the input range of the analog-to-digital converter circuit,
  comparing at least the first analog signal level with the ramp signal,
  enabling a counting in function of the comparing of the ramp signal with at least the first analog signal level, and
  determining the digital value as the function of the count reached at the intersection point of the ramp signal with at least the first analog signal level,
  wherein the method is implemented by the analog-to-digital converter circuit according to claim 1.

8. The method for analog-to-digital conversion according to claim 7,
  wherein the conversion is performed during a conversion cycle which comprises a ramp selection phase, a counting phase, and a reset phase.

9. The method for analog-to-digital conversion according to claim 8,
  wherein during the reset phase the ramp signal assumes its constant and adjustable starting level,
  wherein during the ramp selection phase the at least first analog signal level is compared to the starting level of the ramp signal and a configuration signal is generated accordingly for selecting the first or the second section of the ramp signal in the subsequent counting phase, and
  wherein during the counting phase the ramp signal splits into the first and the second section, wherein one of the first and the second section is used for comparing at least the first analog signal level with the ramp signal depending on the configuration signal generated during a preceding ramp selection phase.

10. The method for analog-to-digital conversion according to claim 9,
  wherein depending on the configuration signal generated during the ramp selection phase either the count reached at the intersection point of the ramp signal with at least the first analog signal level is determined as the digital value, or an inverted form of the count reached at the intersection point of the ramp signal with at least the first analog signal level is determined as the digital value.

11. The method for analog-to-digital conversion according to claim 7,
  wherein the counting starts from a middle of a predefined digital scale and is effected by counting upwards until a highest value of the digital scale or by counting downwards until a lowest value of the digital scale.

12. The method for analog-to-digital conversion according to claim 7, wherein the generating the ramp signal is effected such that the starting level of the ramp signal is adjusted to a middle of the input range of the analog-to-digital converter circuit and the first section's rising is mirror symmetric to the second section's falling, wherein the starting level represents an axis of symmetry.

13. The method for analog-to-digital conversion according to claim 7, wherein the generating the ramp signal is effected such that the first section is rising according to a first adjustable gradient and that the second section is falling according to a second adjustable gradient.

* * * * *